United States Patent
Sumitomo et al.

(10) Patent No.: US 8,174,035 B2
(45) Date of Patent: May 8, 2012

(54) NITRIDE-BASED SEMICONDUCTOR LIGHT EMITTING DEVICE

(75) Inventors: Takamichi Sumitomo, Itami (JP); Masaki Ueno, Itami (JP); Takashi Kyono, Itami (JP); Yohei Enya, Itami (JP); Yusuke Yoshizumi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 117 days.

(21) Appl. No.: 12/836,090

(22) Filed: Jul. 14, 2010

(65) Prior Publication Data

US 2011/0012126 A1    Jan. 20, 2011

(30) Foreign Application Priority Data

Jul. 15, 2009 (JP) ................... P2009-166924

(51) Int. Cl.
*H01L 33/00* (2010.01)

(52) U.S. Cl. .......... 257/94; 257/96; 257/97; 257/103; 257/E33.028; 257/E33.033

(58) Field of Classification Search ............. 257/94, 257/96, 97, 103, E33.025, E33.028, E33.033
See application file for complete search history.

(56) References Cited

U.S. PATENT DOCUMENTS

| | | | |
|---|---|---|---|
| 6,399,966 B1 * | 6/2002 | Tsuda et al. | 257/103 |
| 6,924,512 B2 * | 8/2005 | Tsuda et al. | 257/97 |
| 8,013,356 B2 * | 9/2011 | Tanaka et al. | 257/99 |
| 2003/0001238 A1 | 1/2003 | Ban | |
| 2003/0132442 A1 | 7/2003 | Chang et al. | |

(Continued)

FOREIGN PATENT DOCUMENTS

EP   2 043 167 A1   4/2009

(Continued)

OTHER PUBLICATIONS

Tyagi et al., "Stimulated Emission at Blue-Green (480 nm) and Green (514 nm) Wavelengths from Nonpolar (*m*-plane) and Semipolar (11-22) InGaN Multiple Quantum Well Laser Diode Structures," Applied Physics Express 1, pp. 091103-1-091103-3 (2008).

(Continued)

*Primary Examiner* — Ngan Ngo
(74) *Attorney, Agent, or Firm* — Venable LLP; Michael A. Sartori

(57) ABSTRACT

An object is to provide a nitride-based semiconductor light emitting device capable of preventing a Schottky barrier from being formed at an interface between a contact layer and an electrode. LD 1 is provided as a nitride-based semiconductor light emitting device provided with a GaN substrate 3, a hexagonal GaN-based semiconductor region 5 provided on a primary surface S1 of the GaN substrate 3 and including a light emitting layer 11, and a p-electrode 21 provided on the GaN-based semiconductor region 5 and comprised of metal. The GaN-based semiconductor region 5 includes a contact layer 17 involving strain, the contact layer 17 is in contact with the p-electrode, the primary surface S1 extends along a reference plane S5 inclined at a predetermined inclination angle θ from a plane perpendicular to the c-axis direction of the GaN substrate 3, and the inclination angle θ is either in the range of more than 40° and less than 90° or in the range of not less than 150° and less than 180°. The GaN-based semiconductor region 5 is lattice-matched with the GaN substrate 3.

3 Claims, 2 Drawing Sheets

U.S. PATENT DOCUMENTS

| | | |
|---|---|---|
| 2004/0259299 A1 | 12/2004 | Bader et al. |
| 2005/0224783 A1* | 10/2005 | Matsuyama et al. ............ 257/14 |
| 2006/0126688 A1 | 6/2006 | Kneissl |
| 2009/0095973 A1* | 4/2009 | Tanaka et al. .................... 257/99 |
| 2010/0002738 A1* | 1/2010 | Takakura et al. ........ 372/44.011 |
| 2010/0032644 A1 | 2/2010 | Akita et al. |
| 2010/0059759 A1 | 3/2010 | Akita et al. |
| 2011/0186860 A1* | 8/2011 | Enya et al. ...................... 257/76 |

FOREIGN PATENT DOCUMENTS

| | | |
|---|---|---|
| EP | 2 056 367 A1 | 5/2009 |
| JP | 11-112029 A | 4/1999 |
| JP | 2008-533723 A | 8/2008 |
| JP | 2009-016467 | 1/2009 |
| JP | 2009-081336 A | 4/2009 |

OTHER PUBLICATIONS

Funato et al., "Blue, Green and Amber InGaN/GaN Light-Emitting Diodes on Semipolar (11-22) GaN Bulk Substrates," Japanese Journal of Applied Physics, vol. 45, No. 26, pp. L659-L662 (2006).

* cited by examiner

NITRIDE-BASED SEMICONDUCTOR LIGHT EMITTING DEVICE

BACKGROUND OF THE INVENTION

1. Field of the Invention

The present invention relates to a nitride-based semiconductor light emitting device.

2. Related Background Art

Patent Document 1 discloses a structure of high-efficiency GaN (gallium nitride)-based optical semiconductor device. The light emitting device being the optical semiconductor device of Patent Document 1 is provided with a plurality of GaN-based semiconductor layers including strained quantum well layers. This light emitting device is formed by successively depositing an n-type GaN contact layer, an n-type AlGaN cladding layer, multiple strained quantum well layers, a p-type AlGaN cladding layer, and a p-type GaN contact layer on a substrate of sapphire, SiC, GaN, or the like. Furthermore, an n-electrode and a p-electrode are formed on the n-type GaN contact layer and on the p-type GaN contact layer, respectively, as electrodes for the respective layers. The multiple strained quantum well layers used are GaInN/GaN multiple strained quantum well layers or GaInN/GaInN multiple strained quantum well layers. The plane orientation of the growth face of the multiple strained quantum well layers is different from the orientation in which the piezoelectric field is maximum.

Patent Document 1: Japanese Patent Application Laid-open No. 11-112029

SUMMARY OF THE INVENTION

The above-described conventional optical semiconductor device is provided with the p-type GaN contact layer and the p-electrode, and the p-electrode is in contact with the p-type GaN contact layer. When the optical semiconductor device is constructed in this structure, p-type GaN has a relatively large work function and thus a Schottky barrier can be formed at an interface between the p-type GaN contact layer and the p-electrode. It is therefore an object of the present invention to provide a nitride-based semiconductor light emitting device capable of preventing the Schottky barrier from being formed at the interface between the contact layer and the electrode.

One aspect of the present invention relates to a nitride-based semiconductor light emitting device. The nitride-based semiconductor light emitting device comprises: a GaN substrate; a hexagonal GaN-based semiconductor region provided on a primary surface of the GaN substrate and comprising a light emitting layer; and an electrode provided on the GaN-based semiconductor region and comprised of metal, the GaN-based semiconductor region comprising a contact layer, the contact layer being strained, the contact layer being in contact with the electrode, the primary surface extending along a reference plane, the reference plane being inclined at a predetermined inclination angle with respect to a plane perpendicular to a c-axis direction of the GaN substrate, the inclination angle being either in the range of more than 40° and less than 90° or in the range of not less than 150° and less than 180°, the GaN-based semiconductor region being lattice-matched with the GaN substrate, the contact layer being comprised of p-type doped InGaN or p-type doped InAlGaN, the contact layer of the p-type doped InGaN having a composition ratio of In in the range of not less than 1% and not more than 20%, and the contact layer of the p-type doped InAlGaN having a composition ratio of In larger than a value obtained by multiplying a composition ratio of Al of the contact layer by 0.22.

In the aspect of the present invention, when the angle between the primary surface of the GaN substrate and the plane perpendicular to the c-axis direction of the GaN substrate is either in the range of more than 40° and less than 90° or in the range of not less than 150° and less than 180°, the GaN substrate is lattice-matched with the GaN-based semiconductor region and compressive stress is thus in an in-plane direction along the reference plane in the contact layer comprised of p-type doped InGaN or p-type doped InAlGaN; consequently, a negative piezoelectric field is in the contact layer. This negative piezoelectric field varies the energy band in the contact layer so as to reduce the Schottky barrier at the interface. When the contact layer is comprised of p-type doped InGaN, the compressive stress remains without being released by lattice relaxation in the contact layer, for example, with the thickness of 10-50 nm, as long as the composition ratio of In of the contact layer is in the range of not less than 1% and not more than 20%; therefore, the Schottky barrier of energy band in the contact layer is reduced. When the contact layer is comprised of p-type doped InAlGaN, the contact layer has the compressive stress on the GaN substrate if the composition ratio of In of the contact layer is larger than a value obtained by multiplying the composition ratio of Al of the contact layer by 0.22.

In the aforementioned aspect of the present invention, the inclination angle is preferably in the range of not less than 63° and less than 83°. When the inclination angle is in the range of not less than 63° and less than 83°, the negative piezoelectric field becomes maximum and the drive voltage is fully reduced.

In the aforementioned aspect of the present invention, a peak wavelength of the light emitting layer is within a predetermined range of not less than 500 nm. Therefore, the drive voltage is reduced even in the case of, the peak wavelength of not less than 500 nm where a voltage drop in the light emitting layer becomes prominent and the drive voltage of the entire device becomes high.

The aforementioned aspect of the present invention provides the nitride-based semiconductor light emitting device capable of preventing the Schottky barrier from being formed at the interface between the contact layer and the electrode.

DESCRIPTION OF THE PREFERRED EMBODIMENTS

Figure 1:
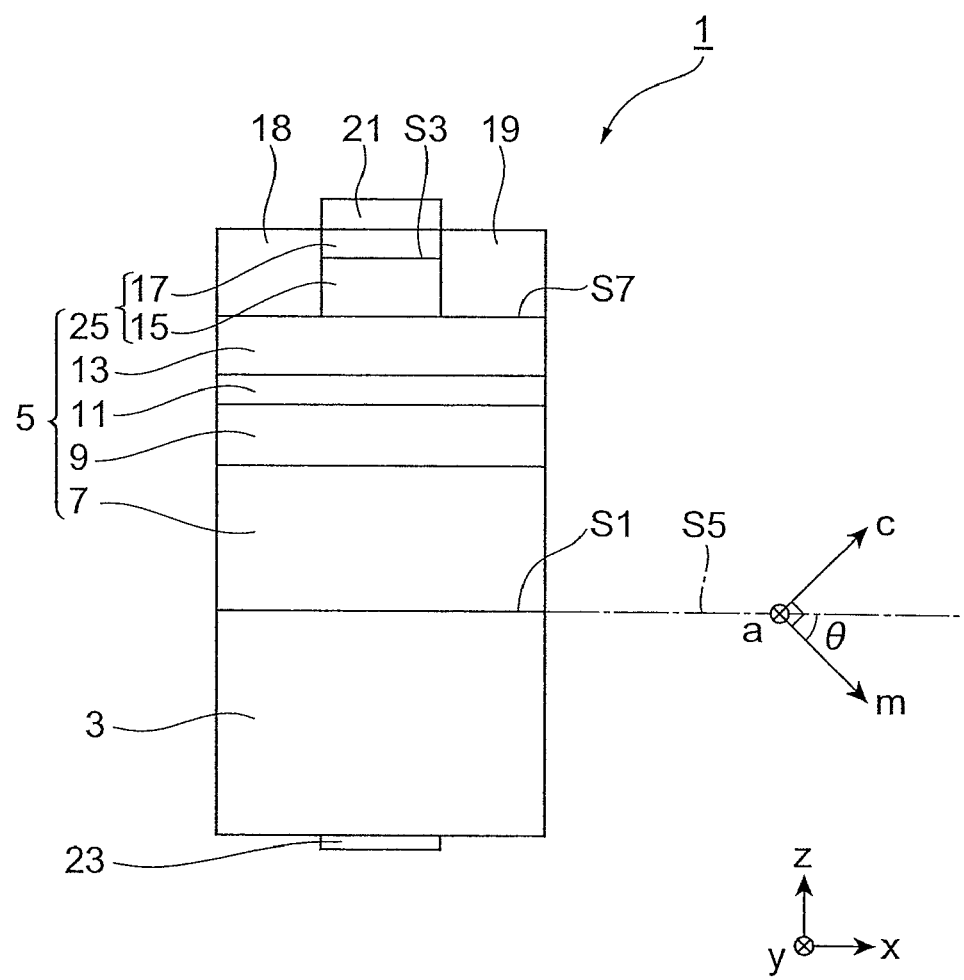
FIG. 1 is a drawing for explaining a configuration of LD according to an embodiment.

Embodiments according to the present invention will be described below in detail with reference to the drawings. In the description of the drawings, the same elements will be denoted by the same reference symbols as much as possible, without redundant description. FIG. 1 is a drawing for explaining a configuration of LD (laser diode) 1 according to an embodiment. LD 1 (a nitride-based semiconductor light emitting device) is provided with a GaN substrate 3, a GaN-based semiconductor region 5, an insulating film 19, a p-electrode 21, and an n-electrode 23. The n-electrode 23, GaN substrate 3, GaN-based semiconductor region 5, and p-electrode 21 are arranged in order along a predetermined z-axis direction.

The GaN substrate 3 is provided between the n-electrode 23 and the GaN-based semiconductor region 5 (particularly, optical confinement layer 7), and is in contact with the n-electrode 23. The GaN substrate 3 has a primary surface S1. The primary surface S1 is opposite to the backside of the GaN substrate 3, and the n-electrode 23 is provided on the backside. The primary surface S1 extends along a reference plane S5 inclined at a predetermined inclination angle θ with respect to a plane perpendicular to the c-axis direction of the GaN substrate 3. The inclination angle θ is either in the range of more than 40° and less than 90° or in the range of not less than 150° and less than 180° (i.e., 40°<θ<90° or 150°≦θ<180°), and more preferably is in the range of not less than 63° and less than 83° (i.e., 63°≦θ<83°).

The GaN-based semiconductor region 5 is provided between the GaN substrate 3 and the p-electrode 21, and is in contact with the primary surface S1 of the GaN substrate 3. The GaN-based semiconductor region 5 is comprised of hexagonal GaN-based semiconductors, and is provided on the primary surface S1. The GaN-based semiconductor region 5 is lattice-matched with the GaN substrate 3. The GaN-based semiconductor region 5 has an optical confinement layer 7, a light guide layer 9, a light emitting layer 11, a light guide layer 13, an optical confinement layer 15, and a contact layer 17. The optical confinement layer 7, light guide layer 9, light emitting layer 11, light guide layer 13, optical confinement layer 15, and contact layer 17 are arranged in order along the z-axis direction on the primary surface S1.

The optical confinement layer 7 is provided between the GaN substrate 3 and the light guide layer 9, and is in contact with the primary surface S1 of the GaN substrate 3. The light guide layer 9 is provided between the optical confinement layer 7 and the light emitting layer 11, and is in contact with the optical confinement layer 7. The light emitting layer 11 is provided between the light guide layer 9 and the light guide layer 13, and is in contact with the light guide layer 9. The light emitting layer 11 has a multiple quantum well structure including a plurality of well layers and a plurality of barrier layers, and the light guide layer 9 is in contact with a barrier layer of the light emitting layer 11. A peak wavelength of the light emitting layer 11 is within a predetermined range of not less than 500 nm (preferably, in the range of not less than 500 nm and not more than 550 nm). The light guide layer 13 is provided between the light emitting layer 11 and the optical confinement layer 15, and is in contact with the light emitting layer 11 (particularly, a barrier layer).

The optical confinement layer 15 is provided between the light guide layer 13 and the contact layer 17, and is in contact with the light guide layer 13. The contact layer 17 is provided between the optical confinement layer 15 and the p-electrode 21, and is in contact with the optical confinement layer 15. The optical confinement layer 15 is in contact with an interface S3 of the contact layer 17. The contact layer 17 is in contact with the p-electrode 21. The n-electrode 23 is in contact with the GaN substrate 3.

The optical confinement layer 15 and the contact layer 17 constitute a stripe-shaped portion 25. The stripe-shaped portion 25 has a ridge shape that extends in the y-axis direction, and is provided on a part of a surface S7 of the light guide layer 13 (which is located on the opposite side to the interface to the light emitting layer 11). The insulating film 18, stripe-shaped portion 25, and insulating film 19 are arranged in order along the x-axis direction on the surface S7 of the light guide layer 13. The stripe-shaped portion 25 is provided between the insulating film 18 and the insulating film 19, and is in contact with the insulating film 18 and the insulating film 19. The insulating film 18 and the insulating film 19 are in contact with the surface S7 of the light guide layer 13.

The below describes an example of LD 1. A 75°-off plane ((20-21) plane) tilting toward the m-axis direction is used as the primary surface S1 of the GaN substrate 3. The optical confinement layer 7 is comprised of InAlGaN (a composition ratio of In of which is 3% and a composition ratio of Al of which is 14%) or AlGaN (a composition ratio of Al of which is 7%) and has the thickness of about 1200 nm. The light guide layer 9 and the light guide layer 13 both are comprised of InGaN (a composition ratio of In of which is 3%) and have the thickness of about 100 nm. The well layers in the light emitting layer 11 all are comprised of InGaN (a composition ratio of In of which is 30%), and have the thickness of about 3 nm. The barrier layers in the light emitting layer 11 all are comprised of InGaN (a composition ratio of In of which is from 0 to 3%) and have the thickness of about 10 nm. A wavelength band of the light emitting layer 11 is a 520 nm band.

The optical confinement layer 15 is comprised of p-type doped AlGaN (a composition ratio of Al of which is 7%) or p-type doped InAlGaN (a composition ratio of In of which is 3% and a composition ratio of Al of which is 14%), and has the thickness of about 400 nm. The contact layer 17 is comprised of p-type doped InGaN or p-type doped InAlGaN, and has the thickness of about 10 to 50 nm. When the contact layer 17 is comprised of p-type doped InGaN, the composition ratio of In of the contact layer 17 is in the range of not less than 1% and not more than 20%. When the contact layer 17 is comprised of p-type doped InAlGaN, the composition ratio of In of the contact layer 17 is larger than a value obtained by multiplying the composition ratio of Al of the contact layer 17 by 0.22. The bandgap energy of the optical confinement layer 15 is larger than that of the contact layer 17.

The insulating film 19 is comprised of $SiO_2$. The p-electrode 21 is comprised of any one of Ni/Au, Pt/Pd, Pd/Au, Al/Ti/Al, Ni/Pt/Au, and Pd/Pt/Au. The n-electrode 23 is comprised of Ti/Al.

The width of the GaN-based semiconductor region 5 in an in-plane direction along the reference plane S5 is about 400 μm, and the height thereof in the direction perpendicular to the reference plane S5 is about 100 μm. The stripe-shaped portion 25 has the width of about 2 μm in the in-plane direction along the reference plane S5 of the GaN-based semiconductor region 5 and the height of about 1 μm in the direction perpendicular to the reference plane S5.

The below schematically describes a method of fabricating LD 1 according to the embodiment. First, a GaN-based semiconductor region corresponding to the GaN-based semiconductor region 5 is formed on a surface of a GaN substrate corresponding to the GaN substrate 3. Next, a portion corresponding to the stripe-shaped portion 25 is formed by dry etching. Then $SiO_2$ insulating film corresponding to the insulating film 18 and the insulating film 19 is deposited by sputtering on a surface formed by the dry etching, and thereafter the p-electrode 21 is formed, followed by division into a plurality of LDs 1.

With LD 1 according to the present embodiment described above, when the angle (inclination angle θ) between the primary surface S1 and the plane perpendicular to the c-axis direction of the GaN substrate 3 is either in the range of more than 40° and less than 90° or in the range of not less than 150° and less than 180°, the GaN substrate 3 and the GaN-based semiconductor region 5 are lattice-matched with each other and therefore compressive stress is in the in-plane direction along the reference plane S5 in the contact layer 17 comprised of p-type doped InGaN or p-type doped InAlGaN; consequently, a negative piezoelectric field is in the contact layer 17. This negative piezoelectric field varies the energy band in the contact layer 17 so as to reduce the Schottky barrier at the interface. Therefore, the operating voltage of LD 1 is reduced. In fact, an actually measured value of the operating voltage of another LD using a contact layer 17a comprised of p-type doped GaN instead of the contact layer 17 of LD 1 was 10 (Volts), whereas an actually measured value of the operating voltage of LD 1 was 6 (Volts).

Figure 2:
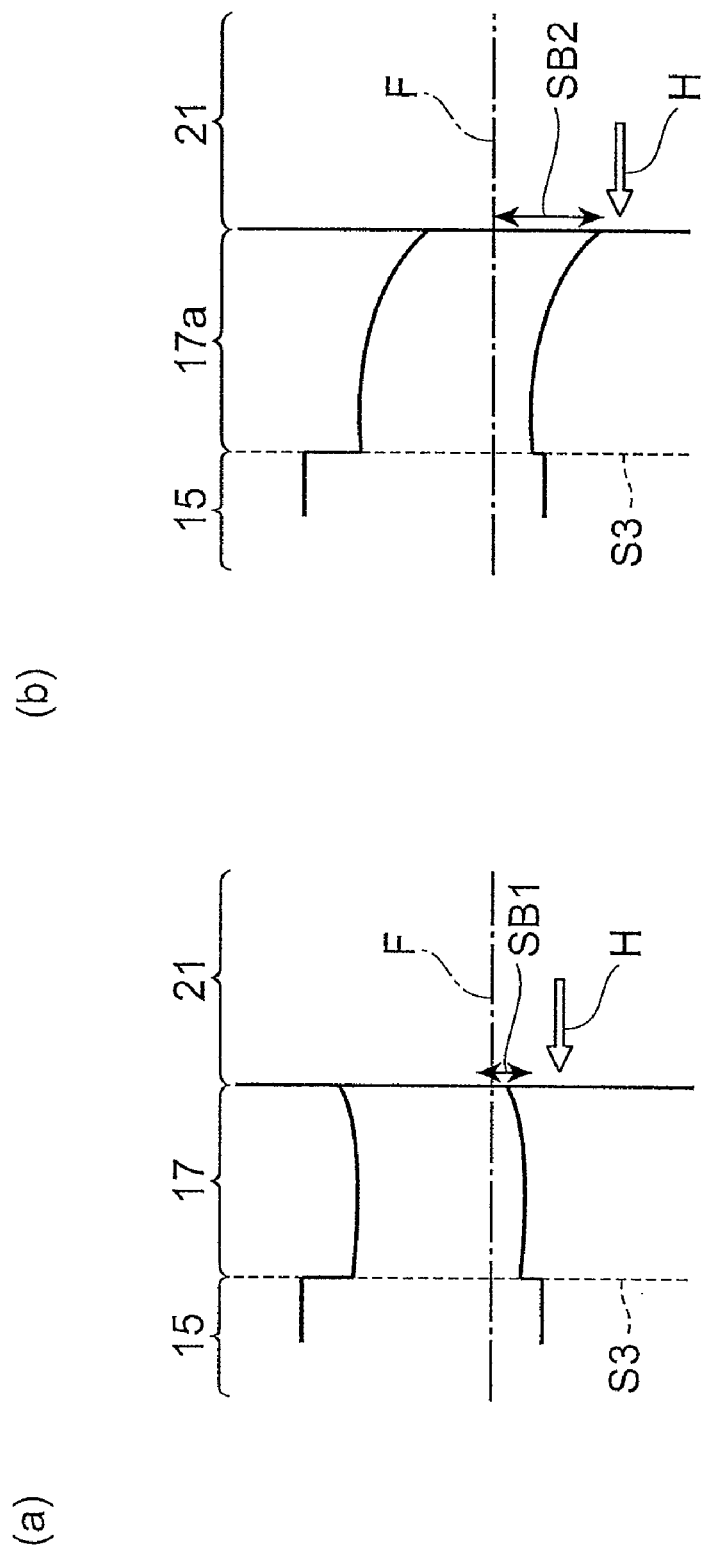
FIG. 2 is a drawing for explaining the effect of LD according to the embodiment.

Part (a) of FIG. 2 shows the bandgap diagram of the optical confinement layer 15 and the contact layer 17. Part (b) of FIG. 2 shows the bandgap diagram of the optical confinement layer 15 and the contact layer 17a of the other LD in which the contact layer 17a of p-type doped GaN is used instead of the contact layer 17 of LD 1 according to the present embodiment. In the drawing, reference symbol F represents the Fermi level and arrow symbol H represents a direction of Hall current. As shown in Part (a) of FIG. 2 and Part (b) of FIG. 2, the bandgap of the contact layer 17 of LD 1 is varied such that the Schottky barrier SB1 of the contact layer 17 of LD 1 becomes smaller than the Schottky barrier SB2 of the contact layer 17a of the other LD.

In the contact layer 17 of p-type doped InGaN, the Schottky barrier of energy band in the contact layer 17 is reduced when the composition ratio of In of the contact layer 17 is not less than 1%, and the compressive stress is released by lattice relaxation in the contact layer 17 with the thickness of 10-50 nm when the composition ratio of In of the contact layer 17 is more than 20%. Therefore, the composition ratio of In of the contact layer 17 is defined in the range of not less than 1% and not more than 20%. In the contact layer 17 of p-type doped InAlGaN, in order to provide the contact layer 17 with compressive stress on the GaN substrate 3, the composition ratio of In of the contact layer 17 is set to a value larger than a value obtained by multiplying the composition ratio of Al of the contact layer 17 by 0.22. When the inclination angle θ is in the range of not less than 63° and less than 83°, the negative piezoelectric field becomes maximum and therefore the drive voltage of LD 1 according to the present embodiment can be fully reduced. If a peak wavelength of the aforementioned other LD is not less than 500 nm, a voltage drop in the light emitting layer 11 becomes prominent to increase the overall drive voltage of LD 1. In contrast to it, the wavelength band of LD 1 according to the present embodiment is the 520 nm band, while achieving the reduction in drive voltage when compared with the foregoing other LD.

The principle of the present invention was illustrated and explained in the preferred embodiments, but it is recognized by those skilled in the art that the present invention can be modified in arrangement and detail without departing from the principle. The present invention is by no means limited to the specific configurations disclosed in the embodiments. Therefore, the applicant claims all modifications and changes falling within the scope of claims and coming from the scope of spirit thereof.

What is claimed is:

1. A nitride-based semiconductor light emitting device comprising:
   a GaN substrate;
   a hexagonal GaN-based semiconductor region provided on a primary surface of the GaN substrate and comprising a light emitting layer; and
   an electrode provided on the GaN-based semiconductor region and comprised of metal,
   the GaN-based semiconductor region comprising a contact layer,
   the contact layer being strained,
   the contact layer being in contact with the electrode,
   the primary surface extending along a reference plane,
   the reference plane being inclined at a predetermined inclination angle with respect to a plane perpendicular to a c-axis direction of the GaN substrate,
   the inclination angle being either in the range of more than 40° and less than 90° or in the range of not less than 150° to less than 180°,
   the GaN-based semiconductor region being lattice-matched with the GaN substrate,
   the contact layer being comprised of p-type doped InGaN or p-type doped InAlGaN,
   the contact layer of the p-type doped InGaN having a composition ratio of In in the range of not less than 1% and not more than 20%, and
   the contact layer of the p-type doped InAlGaN having a composition ratio of In larger than a value obtained by multiplying a composition ratio of Al of the contact layer by 0.22.

2. The nitride-based semiconductor light emitting device according to claim 1, wherein the inclination angle is in the range of not less than 63° and less than 83°.

3. The nitride-based semiconductor light emitting device according to claim 1, wherein a peak wavelength of the light emitting layer is within a predetermined range of not less than 500 nm.

* * * * *